(12) United States Patent
Tom

(10) Patent No.: US 12,662,733 B1
(45) Date of Patent: Jun. 23, 2026

(54) ROTARY MOUNT IN A COATING APPARATUS

(71) Applicant: Meta Platforms Technologies, LLC, Menlo Park, CA (US)

(72) Inventor: Tristan Tom, Hillsborough, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 700 days.

(21) Appl. No.: 18/099,201

(22) Filed: Jan. 19, 2023

(51) Int. Cl.
*C23C 14/50* (2006.01)
*C23C 14/22* (2006.01)

(52) U.S. Cl.
CPC .......... *C23C 14/505* (2013.01); *C23C 14/221* (2013.01)

(58) Field of Classification Search
None
See application file for complete search history.

(56) References Cited

U.S. PATENT DOCUMENTS

| | | | | |
|---|---|---|---|---|
| 3,437,734 A | * | 4/1969 | Roman | ............... H01J 37/3053 |
| | | | | 118/723 VE |
| 3,598,083 A | | 8/1971 | Dort et al. | |
| 3,749,058 A | * | 7/1973 | Slabaugh | .............. C23C 14/505 |
| | | | | 475/11 |
| 4,034,704 A | * | 7/1977 | Wossner | ............... C23C 14/505 |
| | | | | 118/730 |
| 4,036,171 A | * | 7/1977 | Ramet | ..................... C23C 14/26 |
| | | | | 427/259 |
| 4,226,208 A | * | 10/1980 | Nishida | ................... C23C 14/56 |
| | | | | 118/724 |
| 5,138,974 A | * | 8/1992 | Ciparisso | .............. C23C 14/505 |
| | | | | 118/500 |
| 7,190,448 B2 | * | 3/2007 | Ohsawa | ..................... G03F 1/84 |
| | | | | 356/244 |
| 9,812,349 B2 | | 11/2017 | Angelov et al. | |
| 10,403,480 B2 | | 9/2019 | Rogers | |
| 2020/0335331 A1 | | 10/2020 | Xiao et al. | |

FOREIGN PATENT DOCUMENTS

WO 03083162 A1 10/2003

* cited by examiner

*Primary Examiner* — Sylvia Macarthur
(74) *Attorney, Agent, or Firm* — Greenberg Traurig, LLP

(57) ABSTRACT

A rotary mount for mounting a part to be coated in a coating apparatus includes a spindle for rotating about a spindle axis, a cam having a mounting portion for mounting the part to the cam, and a cam profile opposite the mounting portion, the cam being pivotally coupled to the spindle for tilting about a cam axis spaced apart from the spindle axis. A follower member engages the cam profile for imparting a tilt of the cam about the cam axis depending on an angle of rotation of the spindle about the spindle axis. The engagement may be mechanical, magnetic, etc. A motor may be provided in place of the stationary cam member for rotating the cam depending on the tilt angle of the spindle axis. The overall configuration allows parts with spatially varying curvature to be more uniformly coated.

20 Claims, 9 Drawing Sheets

ROTARY MOUNT IN A COATING APPARATUS

TECHNICAL FIELD

The present disclosure relates to coating systems, and in particular to mechanics and electro-mechanics for positioning and handling parts to be coated in a coating system.

BACKGROUND

Visual displays provide information to viewer(s) including still images, video, data, etc. Visual displays have applications in diverse fields including entertainment, education, engineering, science, professional training, advertising, to name just a few examples. Some visual displays such as TV sets display images to several users, and some visual display systems such as near-eye displays (NEDs) are intended for individual users.

An artificial reality system generally includes an NED (e.g., a headset or a pair of glasses) configured to present content to a user. The NED may display virtual objects or combine images of real objects with virtual objects, as in virtual reality (VR), augmented reality (AR), or mixed reality (MR) applications. For example, in an AR system, a user may view images of virtual objects (e.g., computer-generated images (CGIs)) superimposed with the surrounding environment by seeing through a "combiner" component. The combiner of a wearable display is typically transparent to external light but includes some light routing optic to direct the display light into the user's field of view.

A display of HMD or NED may use coated optical components. The optical components may be external such as, for example, a front cover window and/or a combiner component, or internal, such as lenses, waveguides, polarizers, waveplates, display panels, and so on. Since an HMD or NED may have a high degree of optical and optomechanical integration, many of its components may have a complex shape that requires customized optical coatings.

BRIEF DESCRIPTION OF THE DRAWINGS

Exemplary embodiments will now be described in conjunction with the drawings, in which:

FIG. 6 is a magnified view of the rightmost view of FIG. 5, illustrating an improved coating of the part edge due to using the rotary mount of FIG. 4;

DETAILED DESCRIPTION

Figure 1:
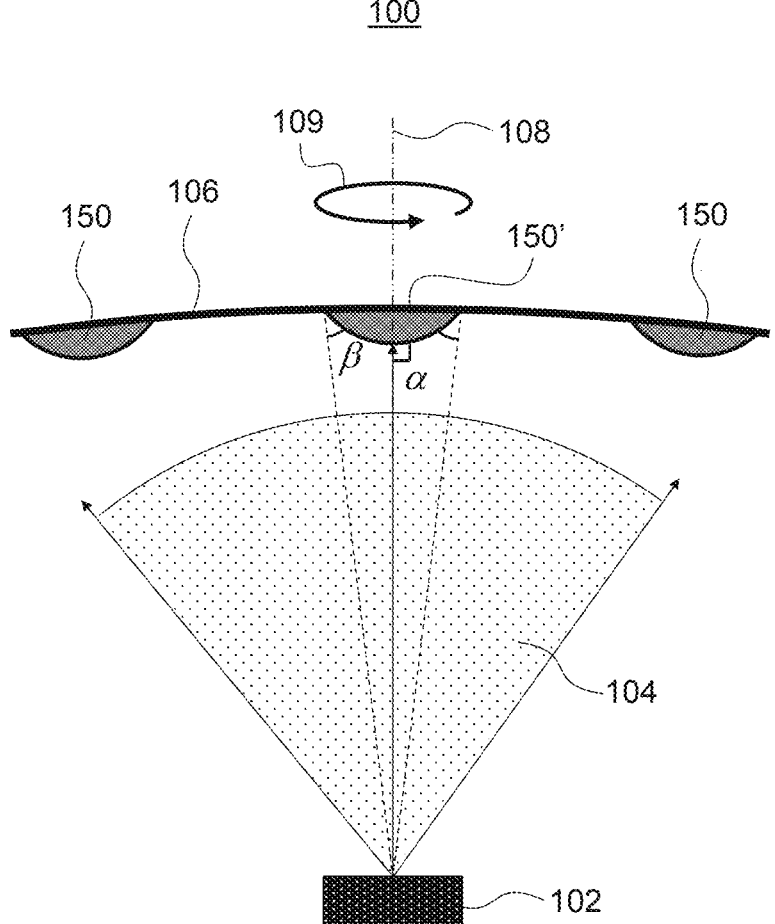
FIG. 1 is a schematic side cross-sectional view of a coating system for coating parts at a spatially varying angle of incidence of a coating beam.

While the present teachings are described in conjunction with various embodiments and examples, it is not intended that the present teachings be limited to such embodiments. On the contrary, the present teachings encompass various alternatives and equivalents, as will be appreciated by those of skill in the art. All statements herein reciting principles, aspects, and embodiments of this disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the terms "first", "second", and so forth are not intended to imply sequential ordering, but rather are intended to distinguish one element from another, unless explicitly stated. Similarly, sequential ordering of method steps does not imply a sequential order of their execution, unless explicitly stated. In FIGS. 1 through FIGS. 8A-8C, similar number refer to similar elements.

Optical components used in a near-eye display may require optical coating, for example a reflector coating, an antireflection coating, a protective coating, a polarizing coating, etc. The optical components may include lenses, waveguides, polarizers, beamsplitters, and other components. Typically, the components are small and have a relatively small curvature or no curvature at all. Such components may be coated by mounting them in a fixed or rotary holder inside a coating chamber. The rotary holder is used to provide a more uniform coating by translating the parts across the coating beam, thus reducing the impact of the non-uniformities in the coating beam. The coating is performed at a constant coating angle.

Fixed or in-plane rotated mounts, however, may not give good coating results when a part to be coated is large and/or has a tight radius of curvature or a non-constant/changing radius of curvature across the part's surface, because the coating thickness depends on the angle of incidence of the particles in the coating beam onto the part's surface. For example, in a physical vapor deposition process, a stream of coating particles may impinge onto the part being coated at an oblique angle, causing a reduction of the coating thickness.

In accordance with this disclosure, the part being coated may be rotated in a complex manner depending on the part's geometry. Such a complex rotation may be achieved in several ways such as, for example, providing a cam-follower mechanism where the cam is rotary and the follower is fixed. The cam-follower actuation may be mechanical, magnetic, etc. In some embodiments, a motor may be provided for rotating the part depending on the portion of the part being coated, so as to follow the local curvature of the part.

In accordance with the present disclosure, there is provided a rotary mount for mounting a part to be coated in a coating apparatus. The rotary mount comprises a spindle for rotating about a spindle axis, a cam comprising a mounting portion for mounting the part thereto, and a cam profile opposite the mounting portion, the cam being pivotally coupled to the spindle for tilting about a cam axis spaced apart from the spindle axis, and a follower member for engaging the cam profile for imparting a tilt of the cam about the cam axis depending on an angle of rotation of the spindle about the spindle axis.

In embodiments where the follower member is stationary, the follower member may engage the cam profile via a sliding contact with the cam profile. The spindle may be configured to oscillate between first and second angles of rotation or to continuously rotate in a clockwise or a counterclockwise direction, for a more uniform exposure of the part to a coating beam. The cam profile may be selected to tilt the cam about the cam axis proximate the first and second angles of rotation of the spindle to increase an angle of tilt of the part relative to the coating beam for a more uniform exposure of the part to the coating beam at edges of the part. The follower member may include a first magnet at an end facing the cam profile, and the cam profile may include a plurality of second magnets for magnetic engagement with the first magnet as the spindle rotates. The cam axis may be parallel to the spindle axis, and/or may be disposed between the mounting portion and the cam profile.

In some embodiments, the rotary mounts comprises a rotary platform for rotating about a platform axis, and the spindle axis is mounted to the rotary platform. The platform axis may be perpendicular to the spindle axis.

In accordance with the present disclosure, there is provided a rotary mount for mounting a part to be coated in a coating system. The rotary mount comprises a spindle for rotating about a spindle axis, a support for supporting the part, pivotally coupled to the spindle for tilting about a support axis spaced apart from the spindle axis, and a motor, e.g. a stepper motor, for controllably tilting the support about the support axis. The support axis may be oriented parallel to the spindle axis. The rotary mount may further include a controller configured to cause the motor to tilt the support about the support axis depending on an angle of rotation of the spindle about the spindle axis.

In some embodiments, the spindle is configured to oscillate between first and second angles of rotation or to continuously rotate in a clockwise or a counterclockwise direction, for a more uniform exposure of the part to a coating beam. The controller may be configured to cause the motor to tilt the support about the support axis proximate the first and second angles of rotation of the spindle, to increase an angle of tilt of the part relative to the coating beam for a more uniform exposure of the part to the coating beam at edges of the part.

In accordance with the present disclosure, there is further provided a coating apparatus comprising a beam source for providing a coating beam, and a rotary mount of this disclosure. The coating apparatus may include a collimator for collimating the coating beam.

Referring now to FIG. 1, a coating apparatus 100 includes a beam source 102, e.g. an evaporation source, for providing a coating beam 104, and a rotary platform 106, which may rotate about a platform axis 108 as indicated with an arrow 109. Parts 150, 150' to be coated are mounted to the rotary platform 106 to face the coating beam 104. In operation, the rotary platform 106 rotates about the platform axis 108, while the beam source 102 provides a coating beam 104. The rotation of the rotary platform 106 about the platform axis 108 provides a more uniform exposure of the parts 150, 150' to the coating beam 104. The coating apparatus 100 may be used for physical vapor deposition (PVD), for example.

The coating apparatus 100 works reasonably well for parts with a large radius of curvature, i.e. parts with small surface curvature, or for flat parts. More curved parts, however, are not coated very uniformly by the coating apparatus 100. For example, the central part 150' is coated at a normal angle of incidence a at its central portion, and at an oblique angle of incidence 8 at its edges, causing the coating to thin down towards the edges of the central part 150'. For the side parts 150, the non-uniformity issue is even more exacerbated.

Figure 2B:
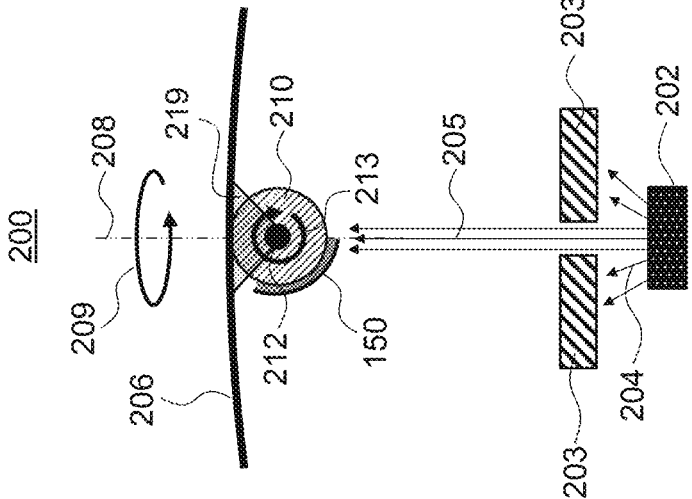
FIG. 2B is a schematic side cross-sectional view of the coating system of FIG. 2A, with the part having been rotated at an extreme angle for coating an edge of the part.
Figure 2B:
Figure 2A:
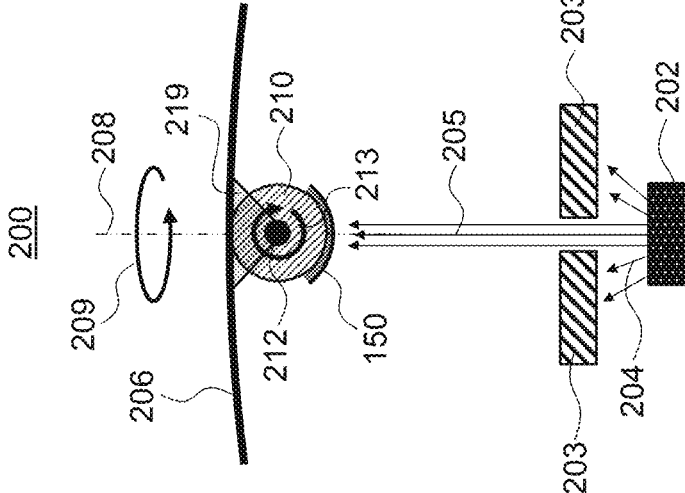
FIG. 2A is a schematic side cross-sectional view of an improved coating system with a high curvature part mounted onto a spindle for rotating the part, with a center of the part facing a collimated portion of the coating beam.
Figure 2A:

Referring to FIGS. 2A and 2B, a coating apparatus 200 is more suitable for coating curved parts and surfaces than the coating apparatus 100 of FIG. 1. The coating apparatus 200 of FIG. 2A includes a beam source 202, e.g. an evaporation source, for providing a coating beam 204, a shield 203 for selecting a collimated portion 205 of the coating beam 204, a rotary platform 206, which may rotate about a platform axis 208 as indicated with an arrow 209, and a spindle 210 mounted to the rotary platform 206 and rotatable about a spindle axis 212 as indicated with an arrow 213. The spindle axis 212 may be mounted to the rotary platform 206 by a pair of mounting brackets 219, or by other suitable mounting component(s).

In operation, the beam source 202 emits the coating beam 204. The shield 203 lets through the collimated portion 205 of the coating beam 204. The collimated portion 205 impinges onto the part 150 being coated. The spindle 210 rotates the part 150 about the spindle axis 212, as can be gleaned by comparing the position and orientation of the part 150 ins FIGS. A and 2B. The spindle 210 and the part 150 also rotate about the platform axis 208 together with the rotary platform 206, to which the spindle axis 212 is coupled via the mounting brackets 219. The spindle 210 may be selected such that its axis of rotation (i.e. the spindle axis 212) coincides, or is proximate to, an origin of the radius of curvature of the part 150, making sure that the collimated coating beam portion 205 always impinges onto a portion of the part 150 being coated at a same angle, e.g. straight angle. Since the collimated portion 205 of the coating beam 204 impinges onto the part 150 at the substantially same straight angle as the part 150 rotates about the spindle axis, the bottom surface of the part 150, i.e. the surface facing the beam source 202, is coated more uniformly in the coating apparatus 200 of FIGS. 2A and 2B than in the coating apparatus 100 of FIG. 1.

Figures 3A, 3B:
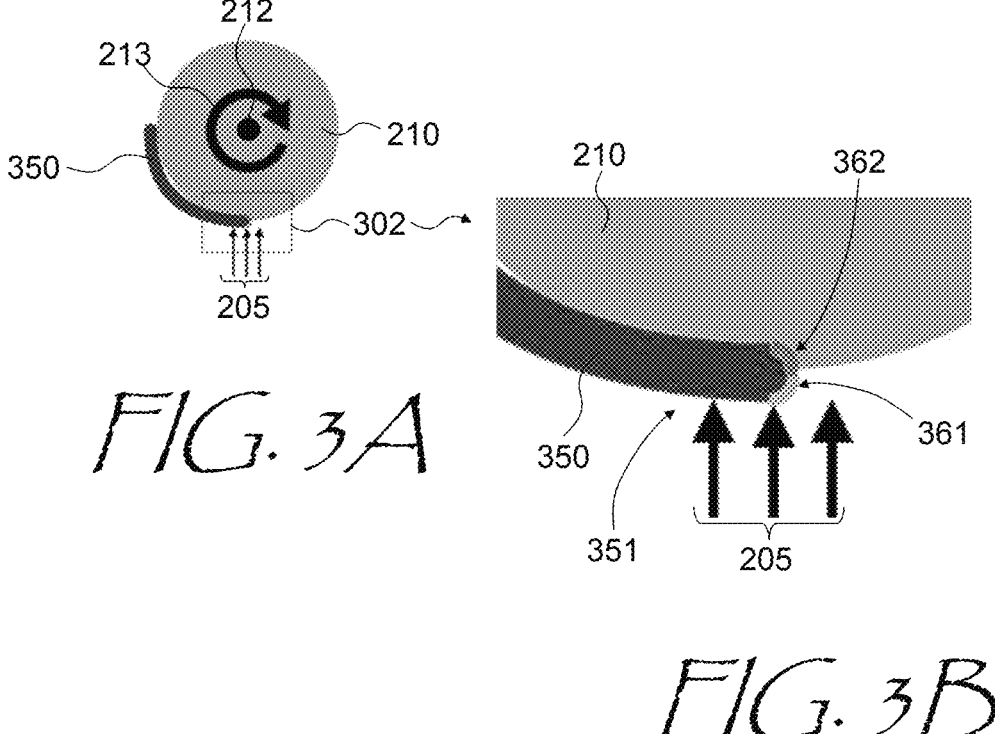
FIG. 3A is a magnified view of the part edge of FIG. 2B mounted on the spindle.
FIG. 3B is a further magnified view of the part edge of FIG. 3A, indicating coated and uncoated portions of the part edge.

The coating apparatus 200 of FIGS. 2A and 2B works well to coat parts with a constant radius of curvature of a surface to be coated. Some parts, however, have a locally varying surface curvature. Referring to FIG. 3A for a non-limiting illustrative example, a curved front cover 350 of a near-eye display is shown mounted to the spindle 210 at an angle of rotation about the spindle axis 212 corresponding to coating an edge 351 of the curved front cover 350. The edge 351 is rounded as better seen in FIG. 3B, which shows a magnified view of an area 302 in FIG. 3A. The collimated coating beam portion 205 only reaches a distal portion 361 of the edge 351 (i.e. farther from the spindle axis 212 of the spindle 210). A proximal portion 362 of the edge 351 remains in the shadow of the distal portion 361 of the edge 351 and thus is not coated, even when the spindle 210 with the mounted front cover 350 is turned to an extreme angle illustrated in FIGS. 3A, 3B.

The uncoated proximal portion 362 of the edge 351 may become a location of moisture entry under the coating, causing reliability problems such as delamination, cracking, coating failure, visible spots or stains, etc. It is therefore desirable for a coating apparatus to have the ability to deposit materials not only at the distal portion 361 of the edge 351, but, at least to some degree, at the proximal portion 362 of the edge 351. Such an over-edge exposure capability would allow a more reliable and environmentally stable coating to be formed on the front cover 350, improving its visual appearance and reliability.

Figures 4A, 4B, 4C:
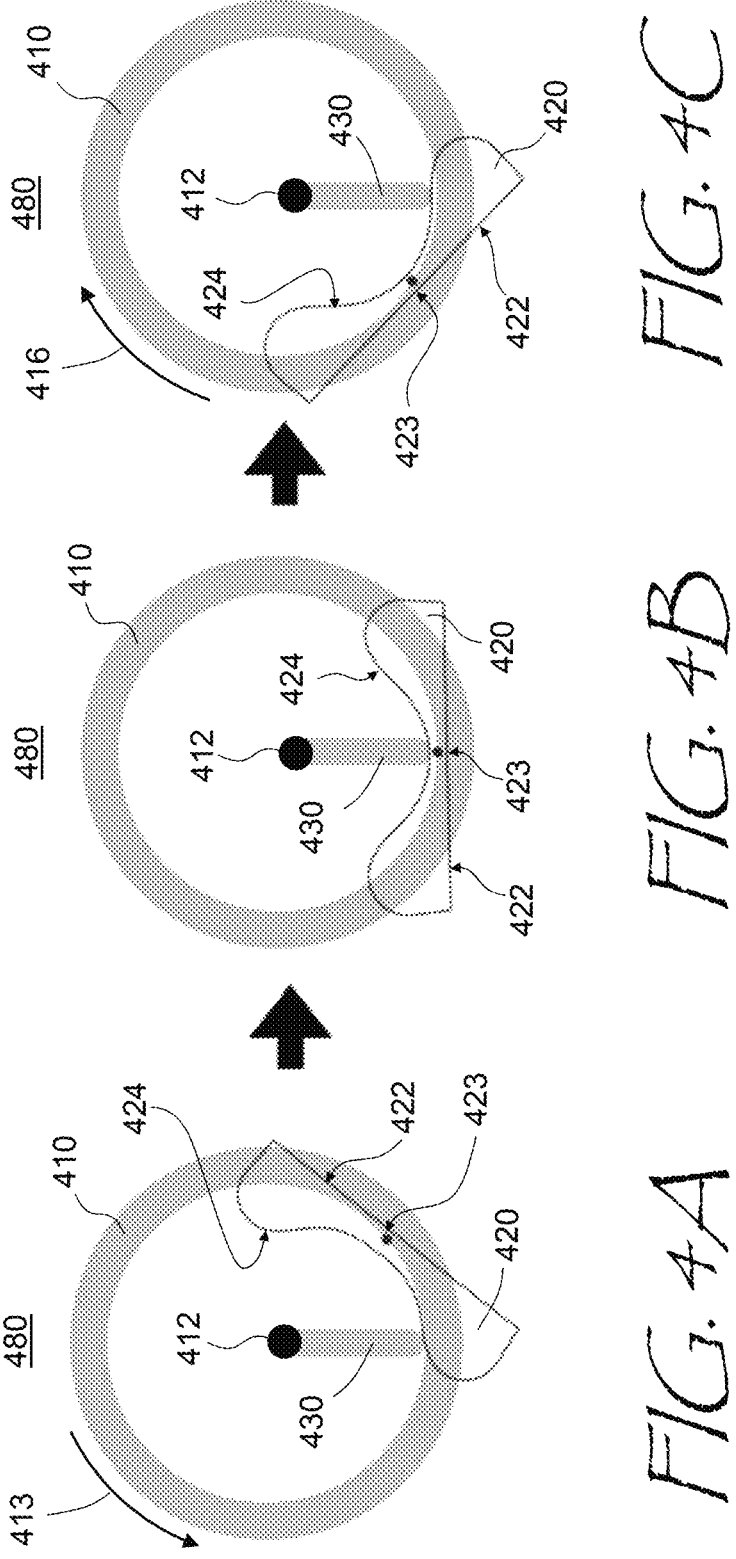
FIGS. 4A, 4B, and 4C are views of a rotary mount of this disclosure, the rotary mount including a rotatable cam and a stationary follower, the views of FIGS. 4A, 4B, and 4C illustrating a progression of the cam rotation.

A non-limiting illustrative example of a rotary mount for mounting a part in a coating apparatus so as to allow the over-edge coating is presented in FIGS. 4A, 4B, and 4C. A rotary mount 480 includes a spindle 410 configured for rotation about a spindle axis 412 oriented perpendicular to the plane of FIGS. 4A, 4B, and 4C. The rotary mount 480 further includes a cam 420. The cam 420 includes a mounting portion 422 for mounting a part to be coated. The part may be mounted to the mounting portion 422 using adapters, brackets, screws, etc. The cam 420 further includes a cam profile 424 disposed opposite the mounting portion 422. The cam 420 is pivotally coupled to the spindle 410 by means of a cam axis 423 spaced apart from the spindle axis 412. The cam 420 is capable of tilting about the cam axis 423. The cam axis 423 is supported by the spindle 410. In the embodiment shown, the cam 423 and spindle 412 axes are parallel to one another. When the two axes are parallel, the amount of rotation imparted by the spindle 410 to the part being coated may be modified (increased or decreased) by the cam 420 rotating about the cam axis 423.

The cam 420 further includes a stationary follower member 430, configured to engage the cam profile 424. The purpose of the stationary follower member 430 is to impart a tilt of the cam 420 about the cam axis 423 depending on an angle of rotation of the spindle 410 about the spindle axis 412. In the embodiment of FIGS. 4A to 4C, the stationary follower member 430 is not moved. It is the cam 420 that is caused to tilt or rotate by the stationary follower 430 when the stationary follower 430 engages the cam 420 with via a sliding contact with the cam profile 424. In other embodiments, a stationary cam and a moving follower may be used.

For example, in FIG. 4A, the cam 420 is at rightmost position after rotating counterclockwise as indicated with an arrow 413, and the stationary follower member 430 causes the cam 420 to rotate counterclockwise by engaging a corresponding portion of the cam profile 424. In FIG. 4B, the cam 420 is in a normal position because the stationary follower member 430 is disposed against a central recess proximate the cam axis 423. In FIG. 4C, the cam 420 is in a leftmost position after rotating clockwise as indicated with an arrow 416, and the stationary follower member 430 causes the cam 420 to rotate clockwise by engaging a corresponding portion of the cam profile 424. The cam 420 may be equipped with return spring(s), not shown for brevity, to cause the cam 420 to adopt a central position when not engaged with the stationary follower member 430.

The cam 420 rotates about the cam axis 423 due to the interaction of the cam profile 424 with the stationary follower member 430. The amount of the cam 420 rotation about the cam axis 423 depends on the angle of rotation of the spindle 410 about the spindle axis 412, and is defined by the cam profile 424.

In the configuration presented in FIGS. 4A, 4B, and 4C, the cam-follower mechanism enables an angle of rotation of the part to be non-linearly increased at extreme angles of rotation or tilt (i.e. the rightmost and leftmost angles) of the spindle 410 shown in FIGS. 4A and 4C. Herein, the term "non-linearly" refers to the additional cam 420 tilt imparted by the cam-follower interaction does not linearly depend on the angle of rotation of the spindle 410 about the spindle axis 412. The specific non-linear tilt profile depends on the part being coated, i.e. on the non-linear profile of the surface being coated, and may be defined by selecting the appropriate cam profile 424.

Figures 5A, 5B, 5C:
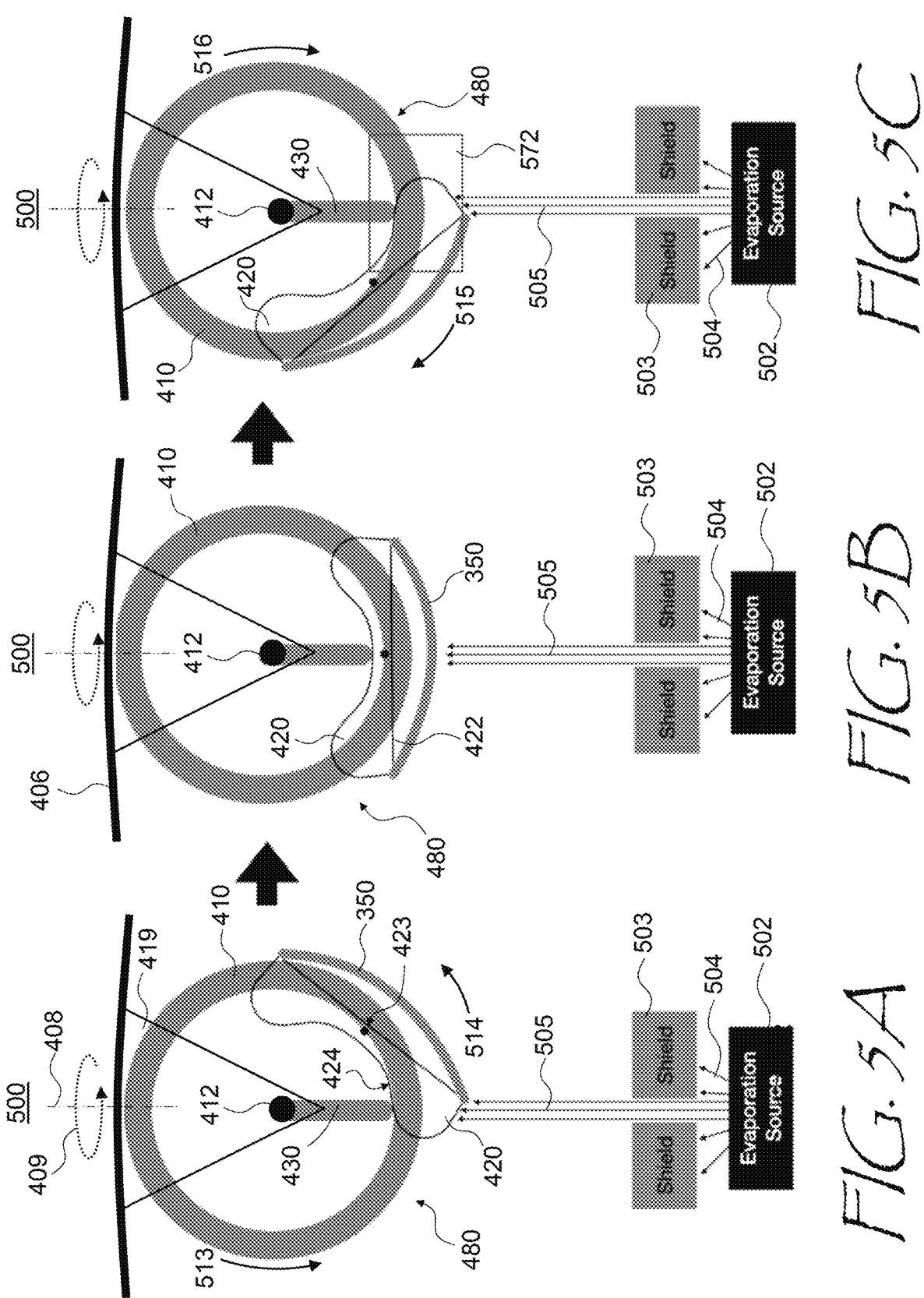
FIGS. 5A, 5B, and 5C are views of a coating apparatus of this disclosure including the rotary mount of FIG. 4, the views of FIGS. 5A, 5B, and 5C illustrating the progression of the coating process.

The effect of the nonlinear tilt angle increase at two extremes of tilting on the ability of a coating apparatus of this disclosure to deposit a coating material over the part edges is illustrated in FIGS. 5A, 5B, and 5C. A coating apparatus 500 of FIGS. 5A, 5B, and 5C is equipped with the rotary mount 480 of FIGS. 4A, 4B, and 4C. The coating apparatus 500 may further include a rotary platform 406 configured to rotate about a platform axis 408 as illustrated with an arrow 409 (FIG. 5A). The spindle axis 412 may be mounted to the rotary platform 406 by a pair of mounting brackets 419. The rotary platform 406 may be considered a part of the rotary mount 480. In the embodiment shown in FIGS. 5A, 5B, and 5C, the platform axis 408 is perpendicular to the spindle axis 412.

The coating apparatus 500 further includes a beam source 502, e.g. an evaporation source, for providing a coating beam 504, and a shield 503 for selecting a collimated portion 505 of the coating beam 504. In operation, the beam source 502 of FIGS. 5A, 5B, and 5C emits the coating beam 504. The shield 503 lets through the collimated portion 505 of the coating beam 504, i.e. the shield 503 operates as a collimator of the coating beam 504. The collimated portion 505 of the coating beam 504 impinges onto the part being coated, in this example the curved front cover 350. The spindle 410 rotates the cam 420 about the spindle axis 412. The curved front cover 350 is mounted on the cam 420. The spindle 410 may be selected such that its axis of rotation 412 coincides, or is proximate to, an origin of the radius of curvature of the curved front cover 350, making sure that the collimated coating beam portion 505 always impinges onto a portion of the curved front cover 350 being coated at a same angle, e.g. straight angle. The spindle 410 and the curved front cover 350 may also rotate about the platform axis 408 together with the rotary platform 406 for better coating uniformity, but this rotation is not impactful for the cam 420 and stationary follower member 430 interaction, and will not be considered in the following explanation for the sake of simplicity.

In FIG. 5A, the spindle 410 is rotated counterclockwise from a central position as indicated with an arrow 513. The stationary follower member 430 pushes onto the left side of the cam profile 424, causing the cam 420 to turn about the cam axis 423 counterclockwise, as indicated with an arrow 514. This turn occurs in the same direction as the turn of the spindle 410, increasing the overall tilt angle by a desired value, and causing the curved front cover 350 to be at least partially coated by the collimated portion 505 of the coating beam 504 around the left-side edge.

In FIG. 5B, the spindle 410 is shown in a central position. At this position and tilt angle, the stationary follower member 430 does not impart additional turns to the curved front cover 350, so it is coated as usual, close to a normal local angle of incidence of the collimated coating beam portion 505 onto the curved front cover 350. In FIG. 5C, the stationary follower member 430 causes the cam 420 to turn about the cam axis 423 in an opposite direction 515 as compared to FIG. 5A. This turn again occurs in the same direction as a turn 516 of the spindle 410, causing the curved front cover 350 to be at least partially coated by the collimated portion 505 of the coating beam 504 around the right-side edge.

Figure 6:
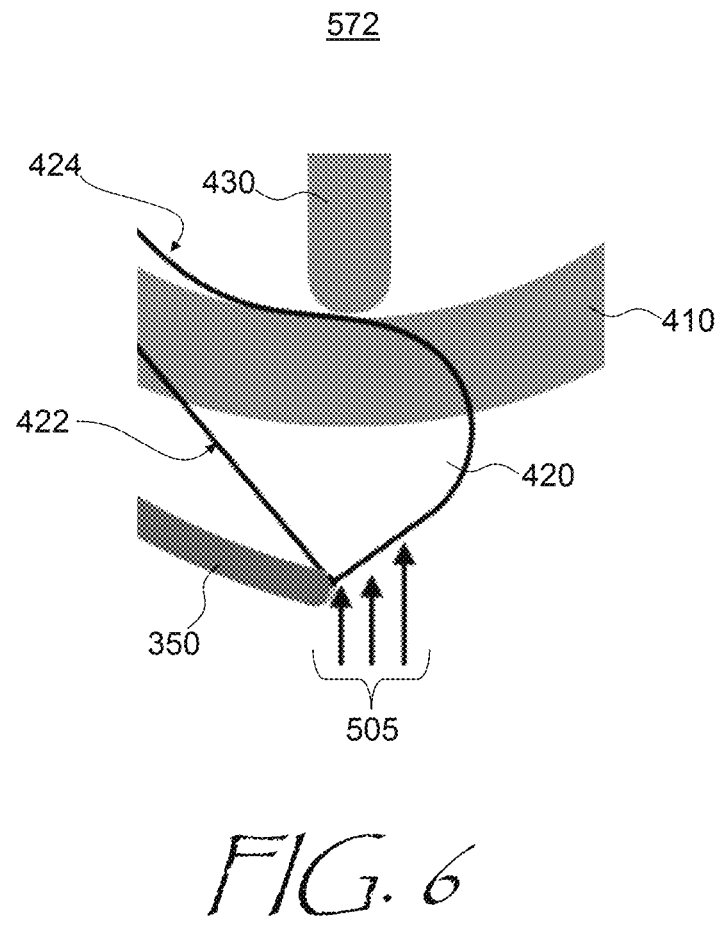

The over-edge coating capability of the coating apparatus 500 is further illustrated in FIG. 6, which is a magnified view of an area 572 of FIG. 5C. The extra turn of the curved front cover 350 afforded by the stationary follower member 430 pushing onto the cam profile 424 allows the coating beam 505 to coat a larger area around the edges of the curved front cover 350.

During the coating process, the spindle 410 oscillates between left and right extreme angles of rotation termed first and second angles of rotation or to continuously rotates in a clockwise or a counterclockwise direction, for a more uniform exposure of the curved front cover 350 to the collimated coating beam portion 505. The cam profile 424 is configured to tilt the cam 420 about the cam axis proximate the first and second angles of rotation of the spindle 410 to increase an angle of tilt of the curved front cover 350 relative to the collimated coating beam portion 505 for a more uniform exposure of the curved front cover 350 to the collimated coating beam portion 505 at edges of the curved front cover 350. The cam profile 424 may be configured to cause the extra turn only close to the extreme angles of tilt of the spindle 410, ensuring that the most of the curved surface of the curved front cover 350 is coated at approximately normal angle of incidence of the collimated portion 505 of the coating beam 504, and only at the edges the angle is increased to allow the edge overcoat. In some embodiments, the rotation of the spindle 410 is a continuous rotation in a clockwise or counterclockwise direction. For such embodiments, several cams 420 may be disposed at the outer perimeter of the spindle 410 for interaction with a same follower. The cams 420 may be evenly spread over the outer perimeter of the spindle 410.

It is to be understood that the curved front cover 350 is only an example, and any part with a varying surface curvature may be coated this way. A custom cam profile may be provided, depending on the part surface curvature profile and the required coating profile. Furthermore, the use of the rotary mount 480, with the platform 406 or without, is not limited to the coating apparatus 500. The rotary mount 480 may be used on any coating apparatus employing directed particle/atom/ion beams to coat a part, such as PVD, sputtering, etc.

Figures 7A, 7B, 7C:
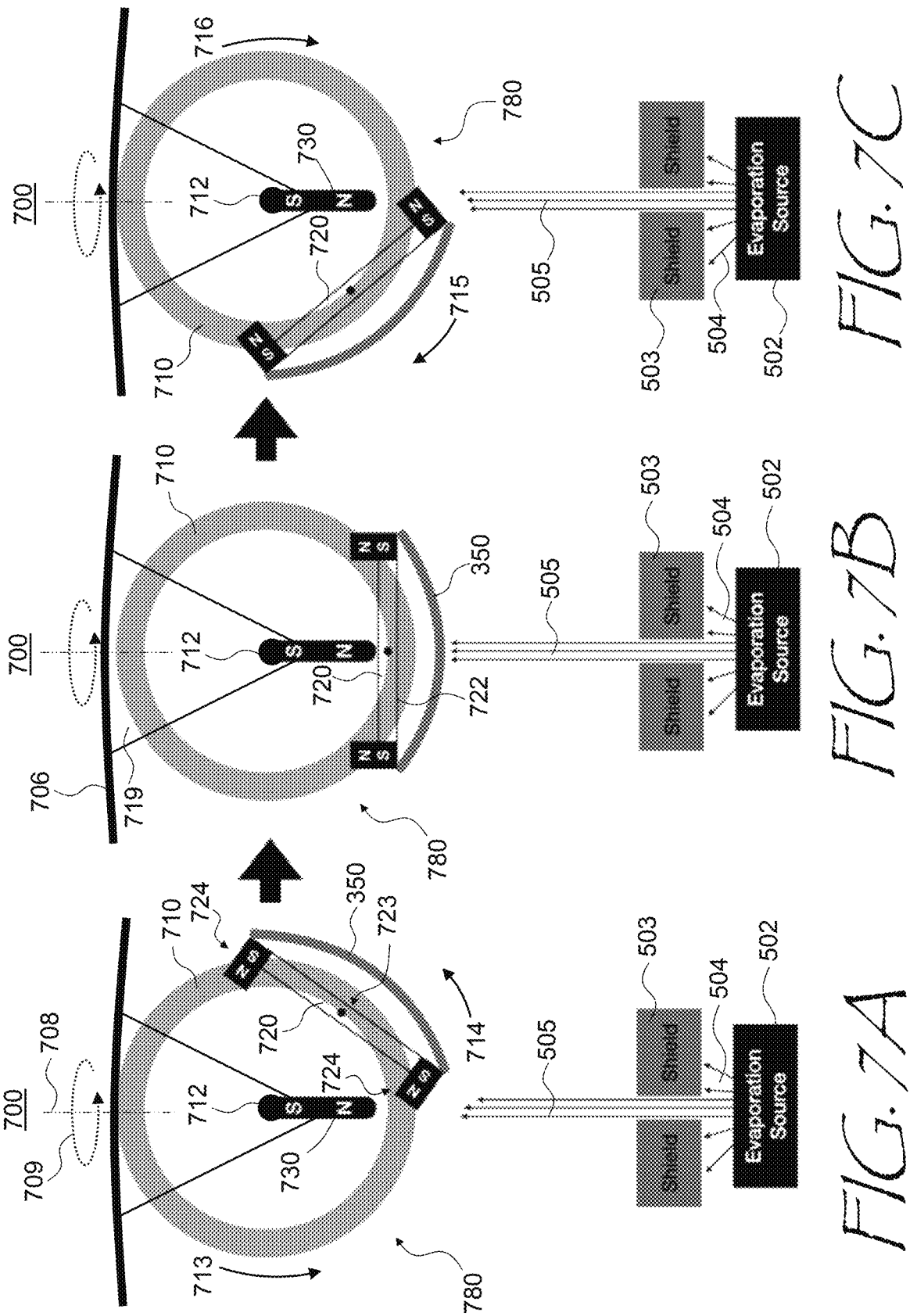
FIGS. 7A, 7B, and 7C views of a coating apparatus embodiment including a magnetically actuated cam-follower system, the views of FIGS. 7A, 7B, and 7C illustrating the progression of the coating process.

Referring now to FIGS. 7A, 7B, and 7C, a coating apparatus 700 is similar to the coating apparatus of FIGS. 5A, 5B, and 5C, and includes similar elements. The coating apparatus 700 further includes the beam source 502 for providing the coating beam 504, and the shield 503 for selecting the collimated portion 505 of the coating beam 504. The collimated portion 505 of the coating beam 504 impinges onto the part being coated, in this example the curved front cover 350.

The coating apparatus 700 of FIGS. 7A, 7B, and 7C is equipped with a rotary mount 780 including a spindle 710 configured to rotate, e.g. oscillate between two directions or continuously rotate in a same direction, about a spindle axis 712, a cam 720 including a mounting side 722 for mounting the curved front cover 350, and cam magnets 724 functioning as a cam profile, and a stationary follower member including a stationary magnet 730 for magnetically engaging cam magnets 724. A rotary platform 706 may be configured for rotation about a platform axis 708 as illustrated with an arrow 709 (FIG. 7A). The spindle axis 712 may be mounted to the rotary platform 706 by a pair of mounting brackets

719. The rotary platform 706 may be considered a part of the rotary mount 780. In the embodiment shown in FIGS. 7A, 7B, and 7C, the platform axis 708 is perpendicular to the spindle axis 712. The spindle 710 rotates the cam 720 about the spindle axis 712. The curved front cover 350 is mounted on the cam 420. The spindle 410 and the curved front cover 350 may also rotate about the platform axis 708 together with the rotary platform 406 for better coating uniformity, but this rotation is not impactful for the cam 720 and stationary follower member 730 interaction, and will not be considered in the following explanation for simplicity.

In FIG. 7A, the spindle 710 is rotated counterclockwise from a central position as indicated with an arrow 713. The stationary magnet 730 engages one of the cam magnets 724 pushing onto the left side of the cam 720, causing the cam 720 to turn about the cam axis 723 counterclockwise as indicated with an arrow 714. This turn occurs in the same direction as the turn of the spindle 710, increasing the overall tilt angle by a desired value, and causing the curved front cover 350 to be at least partially coated by the collimated portion 505 of the coating beam 504 around the left-side edge.

In FIG. 7B, the spindle 710 is shown in a central position. At this position and tilt angle, the stationary magnet 730 does not impart additional turns to the curved front cover 350, so it is coated as usual, close to a normal local angle of incidence of the collimated coating beam portion 505 onto the curved front cover 350.

In FIG. 7C, the magnetic interaction of the stationary magnet 730 and the right-side cam magnet 724 causes the cam 720 to turn about the cam axis 723 in an opposite direction 715 as compared to FIG. 7A. This turn again occurs in the same direction as a turn 716 of the spindle 710, causing the curved front cover 350 to be at least partially coated by the collimated portion 505 of the coating beam 504 around the right-side edge.

During the coating process, the spindle 710 oscillates between left and right extreme angles of rotation termed first and second angles of rotation, for a more uniform exposure of the curved front cover 350 to the collimated coating beam portion 505. The stationary 730 and cam 724 magnets may be configured to tilt the cam 720 about the cam axis 723 proximate the first and second angles of rotation of the spindle 710 to increase an angle of tilt of the curved front cover 350 relative to the collimated coating beam portion 505 for a more uniform exposure of the curved front cover 350 to the collimated coating beam portion 505 at the edges of the curved front cover 350, allowing over-edge coating to occur. The stationary 730 and cam 724 magnets may be configured to cause the extra tilt only close to the extreme angles of tilt of the spindle 710, ensuring that the most of the curved surface of the curved front cover 350 is coated at approximately normal angle of incidence of the collimated portion 505 of the coating beam 504, and only at the edges the angle is increased to allow edge overcoat. In some embodiments, the rotation of the spindle 710 is a continuous rotation in a clockwise or counterclockwise direction. For such embodiments, several cams 720 may be disposed at the outer perimeter of the spindle 710 for interaction with a same magnet. The cams 720 may be evenly spread over the outer perimeter of the spindle 710.

It is to be understood that the curved front cover 350 is merely an example, and any part with a varying surface curvature may be coated this way. A custom cam profile may be provided, depending on the part surface curvature profile and the required coating profile. Furthermore, the use of the rotary mount 780, with the platform 706 or without, is not limited to the coating apparatus 700. The rotary mount 780 may be used on any coating apparatus employing directed particle/atom/ion beams to coat a part.

Figures 8A, 8B, 8C:
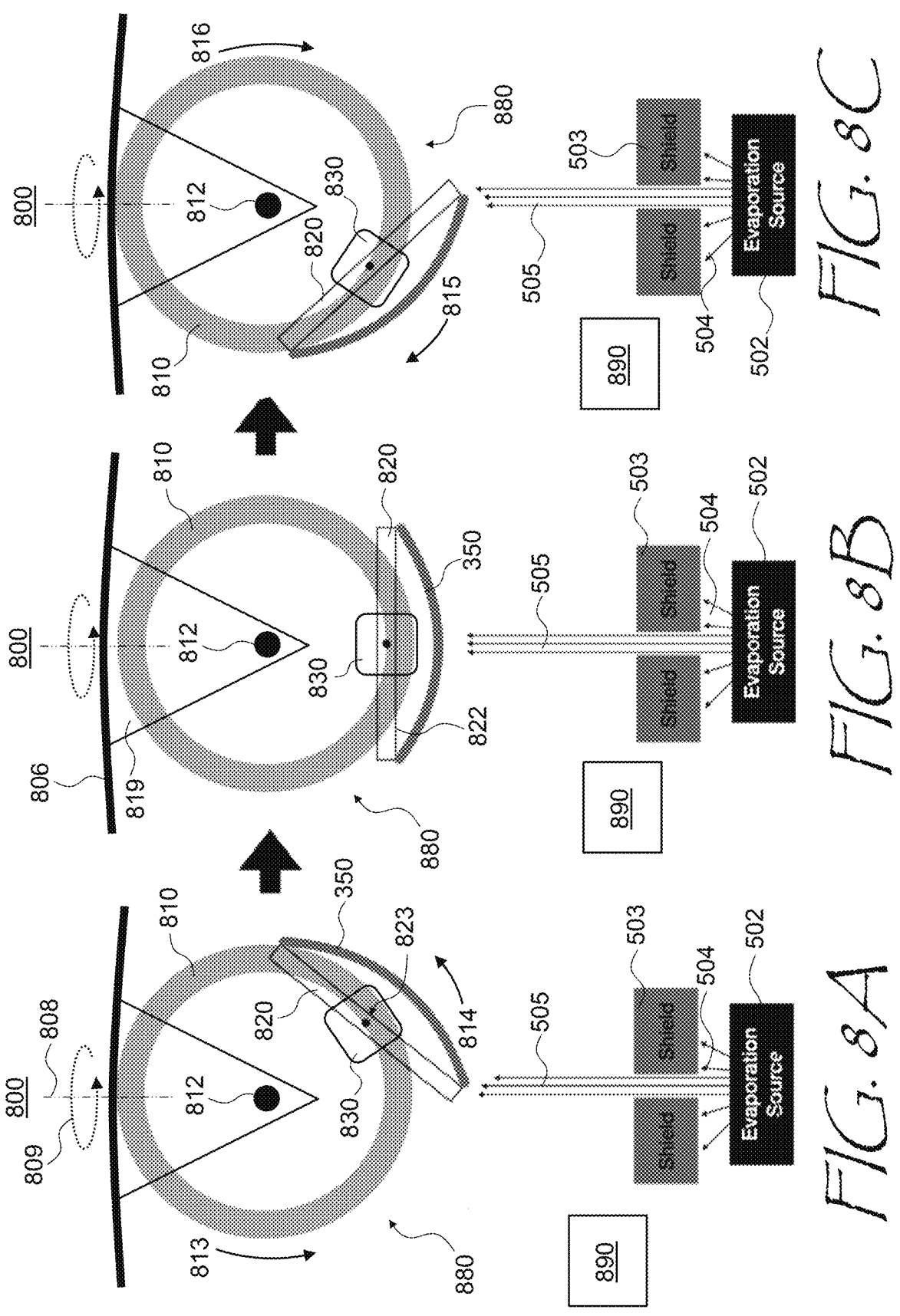
FIGS. 8A, 8B, and 8C views of a coating system embodiment including a motor-actuated mount support, the views of FIGS. 8A, 8B, and 8C illustrating the progression of the coating process.

Turning to FIGS. 8A, 8B, and 8C, a coating apparatus 800 also includes the beam source 502 for providing the coating beam 504, and the shield 503 for selecting the collimated portion 505 of the coating beam 504. The collimated portion 505 of the coating beam 504 impinges onto the part being coated, such as the curved front cover 350. The coating apparatus 800 of FIGS. 8A, 8B, and 8C is equipped with a rotary mount 880 including a spindle 810 configured to rotate about a spindle axis 812, a support 820 including a mounted surface 822 for supporting a part to be coated, in this example the curved front cover 350, and a motor 830, e.g. a stepper motor, a servo motor, etc., for controllably tilting the support 820 about a support axis 823. A rotary platform 806 may be configured for rotation about a platform axis 808 as illustrated with an arrow 809 (FIG. 8A). The spindle axis 812 may be mounted to the rotary platform 806 using the mounting brackets 819. The rotary platform 806 may be considered a part of the rotary mount 880. In the embodiment shown in FIGS. 8A, 8B, and 8C, the platform axis 808 is perpendicular to the spindle axis 712. The spindle 810 may rotate about the platform axis 808 together with the rotary platform 806 for better coating uniformity.

The spindle 810 is configured to oscillate between extreme angles of rotation, termed herein first and second angles of rotation, for a uniform exposure of the curved front cover 350 to the collimated portion 505 of the coating beam 504. The coating apparatus 800 may further include a controller 890 operably coupled to the motor 830 and configured to cause the motor 830 to tilt the support 820 about the support axis 823 depending on an instant angle of rotation of the spindle 810 about the spindle axis 812.

In FIG. 8A, the spindle 810 is rotated counterclockwise from a central position as indicated with an arrow 813. The controller 890 causes the motor 830 to turn the support 820 about the support axis 823 counterclockwise as indicated with an arrow 814. This turn occurs in the same direction as the turn of the spindle 810, increasing the overall tilt angle by a desired value, and causing the curved front cover 350 to be at least partially coated by the collimated portion 505 of the coating beam 504 around the left-side edge.

In FIG. 8B, the spindle 810 is shown in a central position. At this position and tilt angle, the motor 830 does not impart additional turns to the curved front cover 350, so it is coated as usual, close to a normal local angle of incidence of the collimated coating beam portion 505 onto the curved front cover 350. In FIG. 8C, the motor 830 causes the support 820 to turn about the support axis 823 in an opposite direction 815 as compared to FIG. 8A. This turn again occurs in the same direction as a turn 816 of the spindle 810, causing the curved front cover 350 to be at least partially coated by the collimated portion 505 of the coating beam 504 around the right-side edge.

During the coating process, the spindle 810 oscillates between left and right extreme angles of rotation termed first and second angles of rotation, for a uniform exposure of the curved front cover 350 to the collimated coating beam portion 505. The controller 890 may be configured cause the motor 830 to tilt the support 820 about the support axis 823 proximate the first and second angles of rotation of the spindle 810 to increase an angle of tilt of the curved front cover 350 relative to the collimated coating beam portion 505 for a more uniform exposure of the curved front cover 350 to the collimated coating beam portion 505 at the edges of the curved front cover 350. The controller 890 may be configured to operate the motor 830 only close to the extreme angles of tilt of the spindle 810, ensuring that the most of the curved surface of the curved front cover 350 is coated at approximately normal angle of incidence of the collimated portion 505 of the coating beam 504, and only at the edges the angle is increased to allow the edge overcoat. In some embodiments, the rotation of the spindle 810 is a continuous rotation in a clockwise or counterclockwise direction. For such embodiments, several motorized supports 820 may be disposed at the outer perimeter of the spindle 810. The supports 820 may be evenly spread over the outer perimeter of the spindle 810.

It is to be understood that the curved front cover 350 is only an illustrative example, and any part with a varying surface curvature may be coated this way. A custom cam profile may be provided, depending on the part surface curvature profile and the required coating profile. Furthermore, the use of the rotary mount 880, with the platform 806 or without, is not limited to the coating apparatus 800. The rotary mount 880 may be used on any coating apparatus employing directed particle/atom/ion beams to coat a part. In any of the examples considered above, the coating may include an antireflection coating, a high-reflector coating, a partial reflector coating, a reflective polarizer coating, etc. It is to be further noted that any coating apparatus of this disclosure can be used for any PVD coating process, including non-optical coatings and metallic coatings, for example.

Figure 9:
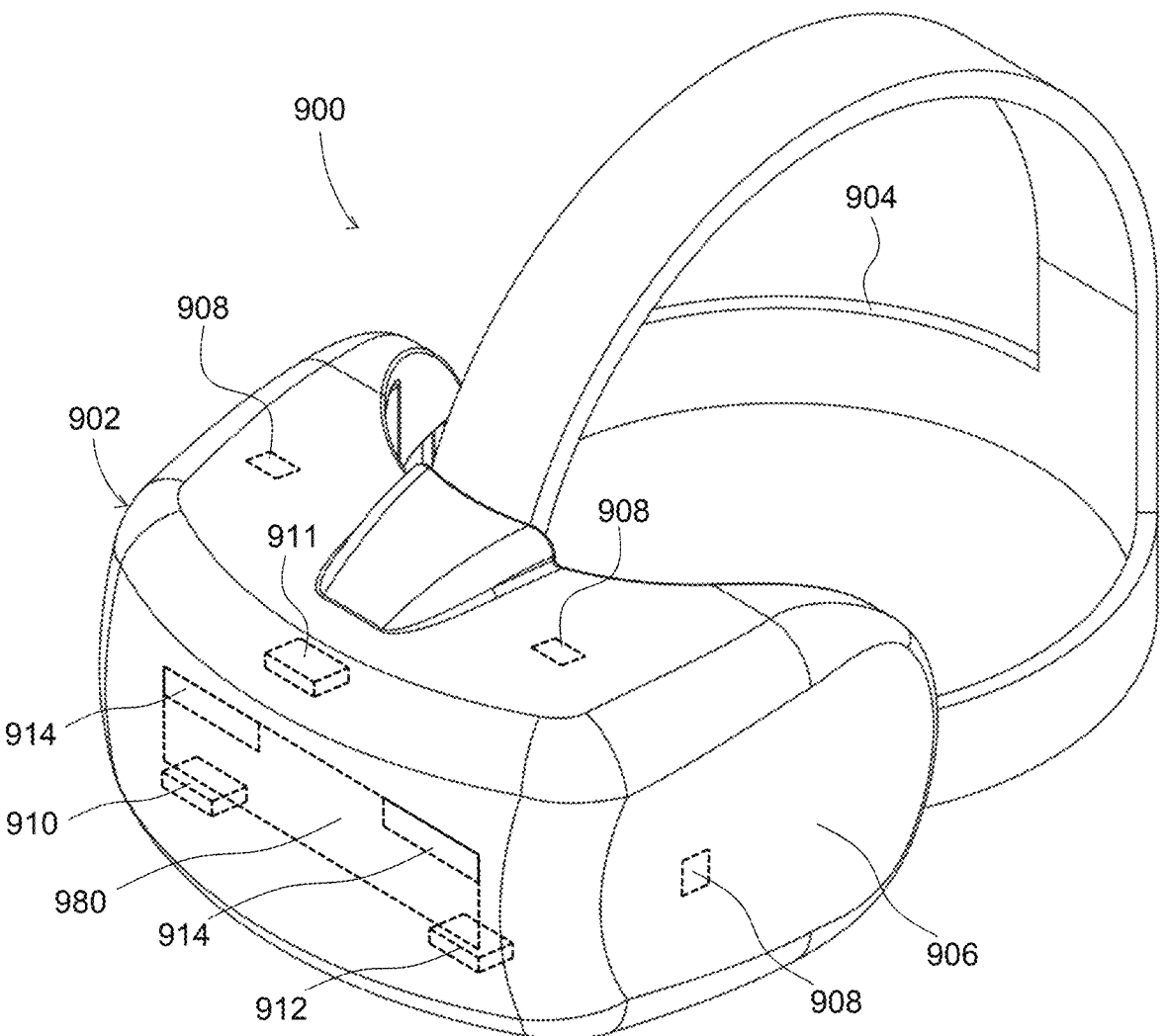
FIG. 9 is a three-dimensional view of a head-mounted display (HMD) having a curved antireflection (AR) front cover coated using a coating apparatus of this disclosure.

Turning to FIG. 9, an HMD 900 is an example of an AR/VR wearable display system that may have the curved coated front cover 350. The HMD 900 encloses the user's face, for a greater degree of immersion into the AR/VR environment. The HMD 900 may generate the entirely virtual 3D imagery. The HMD 900 may include a front body 902 and a band 904 that can be secured around the user's head. The front body 902 is configured for placement in front of eyes of a user in a reliable and comfortable manner. A display system 980 may be disposed in the front body 902 for presenting AR/VR imagery to the user. Sides 906 of the front body 902 may be opaque or transparent.

In some embodiments, the front body 902 includes locators 908 and an inertial measurement unit (IMU) 910 for tracking acceleration of the HMID 900, and position sensors 912 for tracking position of the HMD 900. The IU 910 is an electronic device that generates data indicating a position of the HMD 900 based on measurement signals received from one or more of position sensors 912, which generate one or more measurement signals in response to motion of the HMD 900. Examples of position sensors 912 include: one or more accelerometers, one or more gyroscopes, one or more magnetometers, another suitable type of sensor that detects motion, a type of sensor used for error correction of the IMU 910, or some combination thereof. The position sensors 912 may be located external to the IMU 910, internal to the IMU 910, or some combination thereof.

The locators 908 are traced by an external imaging device of a virtual reality system, such that the virtual reality system can track the location and orientation of the entire HMD 900. Information generated by the IMU 910 and the position sensors 912 may be compared with the position and orientation obtained by tracking the locators 908, for improved tracking accuracy of position and orientation of the HMD 900. Accurate position and orientation is important for presenting appropriate virtual scenery to the user as the latter moves and turns in 3D space.

The HMD 900 may further include a depth camera assembly (DCA) 911, which captures data describing depth information of a local area surrounding some or all of the HMD 900. The depth information may be compared with the information from the IMU 910, for better accuracy of determination of position and orientation of the HMD 900 in 3D space.

The HMD 900 may further include an eye tracking system 914 for determining orientation and position of user's eyes in real time. The obtained position and orientation of the eyes also allows the UN/ID 900 to determine the gaze direction of the user and to adjust the image generated by the display system 980 accordingly. The determined gaze direction and vergence angle may be used to adjust the display system 980 to reduce the vergence-accommodation conflict. The direction and vergence may also be used for displays' exit pupil steering as disclosed herein. Furthermore, the determined vergence and gaze angles may be used for interaction with the user, highlighting objects, bringing objects to the foreground, creating additional objects or pointers, etc. An audio system may also be provided including e.g. a set of small speakers built into the front body 902.

Embodiments of the present disclosure may include, or be implemented in conjunction with, an artificial reality system. An artificial reality system adjusts sensory information about outside world obtained through the senses such as visual information, audio, touch (somatosensation) information, acceleration, balance, etc., in some manner before presentation to a user. By way of non-limiting examples, artificial reality may include virtual reality (VR), augmented reality (AR), mixed reality (MR), hybrid reality, or some combination and/or derivatives thereof. Artificial reality content may include entirely generated content or generated content combined with captured (e.g., real-world) content. The artificial reality content may include video, audio, somatic or haptic feedback, or some combination thereof. Any of this content may be presented in a single channel or in multiple channels, such as in a stereo video that produces a three-dimensional effect to the viewer. Furthermore, in some embodiments, artificial reality may also be associated with applications, products, accessories, services, or some combination thereof, that are used to, for example, create content in artificial reality and/or are otherwise used in (e.g., perform activities in) artificial reality. The artificial reality system that provides the artificial reality content may be implemented on various platforms, including a wearable display such as an HMD connected to a host computer system, a standalone HMD, a near-eye display having a form factor of eyeglasses, a mobile device or computing system, or any other hardware platform capable of providing artificial reality content to one or more viewers.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A rotary mount for mounting a part to be coated in a coating apparatus, the rotary mount comprising:
   a spindle for rotating about a spindle axis;
   a cam including a mounting portion for mounting the part thereto, and a cam profile opposite the mounting portion, the cam being:
   pivotally coupled to the spindle, and
   movable about a cam axis along a range of motion based on an interaction with a
   a stationary follower member, the range of motion being non-linear relative to an
   angle of rotation of the spindle around the spindle axis.

2. The rotary mount of claim 1, wherein the follower member is stationary, and wherein the follower member engages the cam profile via a sliding contact therewith.

3. The rotary mount of claim 2, wherein:
   the spindle is configured to oscillate between first and second angles of rotation or to continuously rotate in a clockwise or a counterclockwise direction, for a more uniform exposure of the part to a coating beam; and
   the cam profile is configured to tilt the cam about the cam axis proximate the first and second angles of rotation of the spindle to increase an angle of tilt of the part relative to the coating beam for a more uniform exposure of the part to the coating beam at edges of the part.

4. The rotary mount of claim 1, wherein the follower member is stationary, and wherein the follower member comprises a first magnet at an end facing the cam profile, the cam profile comprising a plurality of second magnets for magnetic engagement with the first magnet as the spindle rotates.

5. The rotary mount of claim 1, wherein the cam axis is parallel to the spindle axis.

6. The rotary mount of claim 1, wherein the cam axis is disposed between the mounting portion and the cam profile.

7. The rotary mount of claim 1, further comprising a rotary platform for rotating about a platform axis, wherein the spindle axis is mounted to the rotary platform.

8. The rotary mount of claim 7, wherein the platform axis is perpendicular to the spindle axis.

9. A rotary mount for mounting a part to be coated in a coating system, the rotary mount comprising:
   a spindle for rotating about a spindle axis;
   a cam including a mounting portion for mounting the part thereto, and a cam profile opposite the mounting portion, the cam being:
   pivotally coupled to the spindle, and
   movable about a cam axis along a range of motion based on an interaction with a stationary follower member, the range of motion being non-linear relative to an angle of rotation of the spindle around the spindle axis;
   a support for supporting the part, wherein the support is pivotally coupled to the spindle for tilting about a support axis spaced apart from the spindle axis; and
   a motor for controllably tilting the support about the support axis.

10. The rotary mount of claim 9, wherein the support axis is parallel to the spindle axis.

11. The rotary mount of claim 9, wherein the motor comprises a stepper motor.

12. The rotary mount of claim 9, further comprising a controller that is configured to control the motor to tilt the support about the support axis based on an angle of rotation of the spindle about the spindle axis.

13. The rotary mount of claim 12, wherein:
   the spindle oscillates between first and second angles of rotation or to continuously rotate in a clockwise or a counterclockwise direction, for a more uniform exposure of the part to a coating beam; and the controller is configured to control the motor to tilt the support about the support axis proximate the first and second angles of rotation of the spindle, to increase an angle of tilt of the part relative to the coating beam for a more uniform exposure of the part to the coating beam at edges of the part.

14. A coating apparatus for coating a part, the coating apparatus comprising:

a beam source for providing a coating beam;

a rotary mount downstream of the beam source for mounting the part for exposing the part to the coating beam, the rotary mount comprising:

a spindle for rotating about a spindle axis;

a cam including a mounting portion for mounting the part thereto, and a cam profile opposite the mounting portion, the cam being:

pivotally coupled to the spindle, and movable about a cam axis along a range of motion, the range of motion being non-linear relative to an angle of rotation of the spindle around the spindle axis; and a stationary follower member for engaging the cam profile for imparting a tilt of the cam about the cam axis depending on an angle of rotation of the spindle about the spindle axis.

15. The coating apparatus of claim 14, where the stationary follower member engages the cam profile via a sliding contact therewith.

16. The coating apparatus of claim 15, wherein:

the spindle oscillates between first and second angles of rotation or to continuously rotate in a clockwise or a counterclockwise direction, for a more uniform exposure of the part to the coating beam; and the cam profile tilts the cam about the cam axis proximate the first and second angles of rotation of the spindle to increase an angle of tilt of the part relative to the coating beam for a more uniform exposure of the part to the coating beam at edges of the part.

17. The coating apparatus of claim 14, wherein the cam axis is parallel to the spindle axis.

18. The coating apparatus of claim 17, further comprising a rotary platform for rotating about a platform axis, wherein the spindle axis is mounted to the rotary platform.

19. The coating apparatus of claim 17, wherein the follower member is stationary, and wherein the follower member comprises a first magnet at an end facing the cam profile, the cam profile comprising a plurality of second magnets for magnetic engagement with the first magnet as the spindle rotates.

20. The coating apparatus of claim 14, further comprising a collimator for collimating the coating beam.

\* \* \* \* \*